United States Patent [19]

Squillace et al.

[11] 3,859,222

[45] Jan. 7, 1975

[54] SILICON NITRIDE-SILICON OXIDE ETCHANT

[75] Inventors: Anthony S. Squillace, Cypress; Albert E. Martin, Lynwood; Jerald J. Rudmann, Anaheim, all of Calif.

[73] Assignee: North American Rockwell Corporation, El Segundo, Calif.

[22] Filed: Dec. 17, 1973

[21] Appl. No.: 425,473

Related U.S. Application Data

[62] Division of Ser. No. 163,630, July 19, 1971, Pat. No. 3,811,974.

[52] U.S. Cl. .................................. 252/79.3, 156/8

[51] Int. Cl. .................................. C09k 3/00

[58] Field of Search ............. 252/79.2, 79.3; 156/2, 156/3, 8, 11, 13, 17; 96/36.2

[56] References Cited

UNITED STATES PATENTS 3,203,884 8/1965 Gruss et al. ..................... 204/140.5

3,607,480 9/1971 Harrap ........................... 156/11 X

*Primary Examiner*—William A. Powell

*Attorney, Agent, or Firm*—L. Lee Humphries; H. Fredrick Hamann; G. Donald Weber, Jr.

[57] ABSTRACT

This invention discloses a chemical to etchant and a process for chemically etching silicon nitride-silicon oxide composite structure which may be used, for example in microelectronic devices. The etching process or system utilizes a mixture of phosphoric acid and a fluoborate anion containing compound such as fluoboric acid. The etch rate of the silicon nitride relative to the etch rate of the silicon oxide can be controlled to the desired etch rate by varying the temperature of the etchant and/or adjusting the ratio mixture of the phosphoric acid and the fluoboric acid.

3 Claims, 3 Drawing Figures

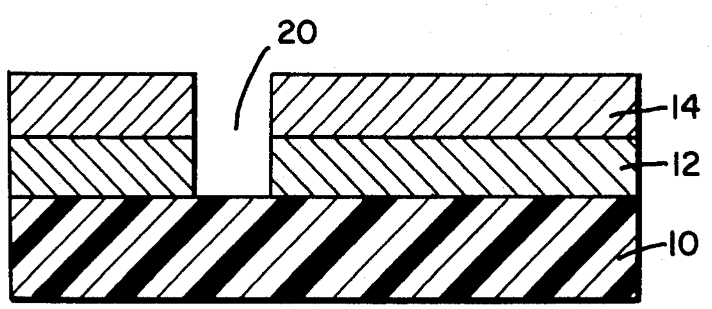

SILICON NITRIDE-SILICON OXIDE ETCHANT

This is a division, of application Ser. No. 163,630 filed July 19, 1971, now U.S. Pat. No. 3,811,974.

BACKGROUND OF THE INVENTION

1. Field of the Invention

This invention relates to etching composite structures and more particularly to a process for etching silicon nitride-silicon oxide composite structures such as may be used in microelectronic devices.

2. Description of Prior Art

The advent of microelectronic devices has introduced many fabrication techniques. The most common technique includes producing a composite structure wherein one or more layers of suitable materials (i.e., insulators, conductors, semiconductors) are disposed one onto the other. Frequently, these layers are disposed one at a time through a suitable mask. The mask is applied to the composite and holes or openings are prodcued in the mask. The masked structure is then subjected to a suitable etching step to prepare the structure for the next layer. The preferred masking technique uses photolithographic processes with, for example, a photoresist mask.

The primary existing etching processes are the refluxing phosphoric acid method and the aqueous hydrofluoric acid method. Each of these methods or systems has limitations set forth hereinafter.

The refluxing phosphoric acid refluxing system is well known for etching silicon nitride. The system utilizes a flask for boiling the phosphoric solution. Silicon nitride wafers are positioned in a tray located on the bottom of the flask. The refluxing action of the boiling phosphoric acid solution etches the silicon nitride. This etching process requires a closed system which limits the use of this technique to small volume production processing. Therefore, this system cannot be regarded as commercially feasible. Even though the refluxing process readily etches silicon nitride, there is serious difficulty in that this etchant essentially does not attack silicon oxide. As a result, this system cannot be adjusted to etch a silicon nitride-silicon oxide composite structure.

The high operating temperature of 180°C is another undesirable feature of the refluxing phosphoric acid system. This elevated temperature coupled with the acid precludes the use of standard photochemical techniques because most photoresists fail to adhere at such temperatures. This high operating temperature also causes water to boil out of the etchant thereby requiring periodical adding of water because the water-acid ratio is critical for proper etching.

The aqueous hydrofluoric acid (HF) system is another well known system for etching silicon oxide-silicon nitride composite structures. The aqueous HF etching system is used to selectively etch silicon oxide. The etchant consists of a mixture of HF and ammonium fluoride ($NH_4F$). The primary difficulty with this system is that in order to achieve reasonable silicon nitride etch rates for example, about (75 A/min) the required concentration of hydrofluoric acid results in severe etching on the silicon oxide (e.g., approximately 10,000A/min. Moreover, this solution attacks the photoresists mask).

Such a severe etch rate on the silicon oxide layer of the silicon nitride-silicon oxide composite produces an unfavorable geometry for further processing e.g. metallization or the like. Accordingly, when concentrations of hydrofluoric acid are utilized which avoid the extreme attack to the silicon oxide structure undesirably low silicon nitride etch rates of the order of about < 10A/min occur which result in abnormal long processing times.

SUMMARY OF THE INVENTION

This invention relates to an etching process or system utilizing a phosphoric acid-fluoboric acid mixture. The etch rate of a composite structure having at least two layers of material having different etch rates such as, for example silicon nitride and silicon oxide, can be controlled to the desired etch rate by (1) controlling the temperature of the etchant in the range between 100° C and 110° C and (2) by adjusting the ratio of the fluoboric acid to the phosphoric acid. The concentration ratio of fluoboric acid ($HBF_4$) or $BF_4^-$ ion species in the mixture may vary from 1–6 parts by weight to 100 parts by weight of phosphoric acid ($H_3PO_4$).

In a typical operation the areas of the composite to be etched are defined by a mask layer of photoresist material commonly used in conventional photolithographic techniques. This mask material is provided on the top surface of the silicon nitride layer. The openings in the mask on the mask area are formed by standard techniques. The composite structure with the formed openings is placed in the phosphoric-fluoboric acid mixture which is heated to an elevated temperature of preferably about 105° C. The composite structure is kept in the heated phosphoric-fluoboric acid mixture until the opening is etched through the silicon nitride and underlying silicon oxide.

IN THE DRAWINGS

FIGS. 1*a*–1*b* and cross-sectional views of the composite structure formed in accordance with this invention.

DETAILED DESCRIPTION

Figure 1A:
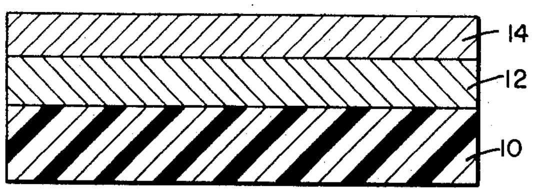

The structure of a typical composite, such as for example, a silicon nitride-silicon oxide composite used in the practice of this invention is shown in FIG. 1*a*.

The substrate 10 is a suitable substrate material such as a silicon wafer which is covered by a layer of silicon oxide 12. The silicon oxide layer 12 is grown by conventional means such as passing steam and dry oxygen over the substrate 10 in a furnace at elevated temperatures for a prescribed time.

On top of the silicon oxide layer 12 is a layer of silicon nitride 14 which forms the top layer of the composite structure. The silicon nitride layer 14 is deposited onto the silicon oxide layer 12 by a suitable method such as mixing silicon tetrachloride and ammonia at elevated temperatures in a furnace. Layer 14 may be formed by any alternate method.

Figure 1B:
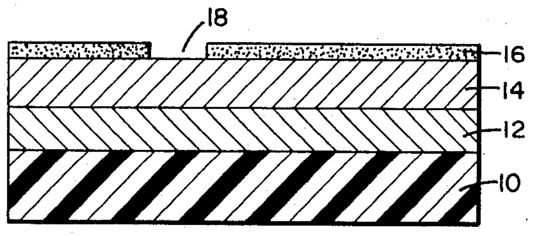

As shown in FIG. 1*b*, a mask layer 16 formed of a photoresist material commonly used in conventional photolithographic techniques is provided on the top surface of the silicon nitride layer 14. The mask layer 16 has an opening 18 therein which is formed by standard techniques.

The masked composite structure shown in FIG. 1*b* is immersed in a heated mixture of phosphoric acid and fluoboric acid having a temperature not exceeding 110° C. A preferred temperature range for the etchant when used in the process is from 100° to 110° C.

The etchant utilizes a mixture of phosphoric acid ($H_3PO_4$) and a fluoborate anion containing compound such as fluoboric acid ($HBF_4$) in various ratios to obtain the desired silicon nitride-silicon oxide etch rates. A preferred mixture ratio for this process is from 1 to 6 parts by weight of fluoborate anion to 100 parts by weight of phosphoric acid.

For example, a concentration ratio of 100 parts per weight of phosphoric acid to one part weight of fluoboric acid and an etchant temperature of 105° C results in a silicon nitride-silicon oxide etch ratio of 1:1 for each layer.

The etch rate of the silicon oxide can be increased by increasing the ratio of fluoboric acid or fluoborate ion containing compound to the 100 parts of phosphoric acid. The etch rate of silicon nitride can be increased by increasing the temperature of the etching solution within the suggested range. The etch rates are selectively varied until the simultaneous etch rate of each layer is substantially similar, e.g., about 100 A/min.

The preferred fluoborate anion containing compound is fluoboric acid. Other sources of the fluoboric anion ($BF_4^-$) are the fluoborate salt of ammonia or alkali metal such as sodium fluoborate.

Figure 1C:
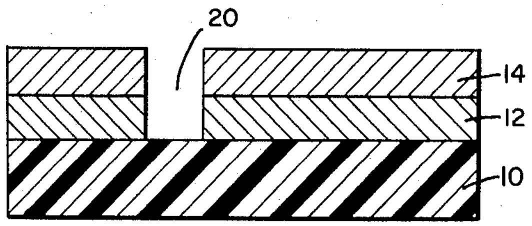

The composite structure is left in the heated fluoboric acidphosphoric acid mixture until the channel 20 is etched through the silicon nitride layer 14 and underlying silicon oxide layer 12 as shown in FIG. 1*c*.

One skilled in the art of etching silicon oxide can closely approximate the depth of etching by observing the change in color of the silicon oxide. A more precise method to determine if the channel area 20 has etched through to the silicon is to conduct a continuity check with an ohm meter. After etching through to the silicon, the photoresist mask layer 16 is then stripped off with a solvent.

The composite structure is then metallized and processed to form the familiar metal nitride-oxide-silicon (MNOS) device.

EXAMPLE

A mask layer of photoresist was formed on a silicon nitride layer which forms the top layer of the silicon nitride-silicon oxide composite structure. Openings were formed in the mask by standard photolithographic techniuqes.

The masked composite structure was placed in the phosphoric fluoboric acid mixture consisting of 100 parts by weight of phosphoric acid to 1 part by weight of fluoboric acid and heated to an elevated temperature of about 105° C.

A silicon nitride-silicon oxide etch ratio of 1:1 was achieved with the absolute etch rate on the order of 100 A per/min for each material. The nitride layer was approximately 300 A thick, the oxide layer was about 1400 A thick. The etchant solution etched through to the underlying silicon oxide layer in about 17 minutes.

We claim:

1. A substantially non-aqueous etchant composition for etching adjacent oxide and nitride layers of a semiconductor material at a controlled rate, said composition consisting of about 1 to 6 parts by weight of fluoborate anion ($BF_4^-$) containing material and about 100 parts by weight of phosphoric acid ($H_3PO_4$), said composition having an operating temperature range between 100°C and 110°C.

2. The etchant composition as described in claim 1 wherein said fluoborate anion containing material is fluoboric acid ($HBF_4$).

3. The etchant recited in claim 1 consisting of 100 parts per weight of phosphoric acid to one part per weight of fluoboric acid at a temperature of 105°C.

* * * * *